(12) United States Patent
Balakrishnan et al.

(10) Patent No.: US 9,780,088 B1
(45) Date of Patent: Oct. 3, 2017

(54) CO-FABRICATION OF VERTICAL DIODES AND FIN FIELD EFFECT TRANSISTORS ON THE SAME SUBSTRATE

(71) Applicant: INTERNATIONAL BUSINESS MACHINES CORPORATION, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/087,495

(22) Filed: Mar. 31, 2016

(51) Int. Cl.
| H01L 27/06 | (2006.01) |
| H01L 29/78 | (2006.01) |
| H01L 29/66 | (2006.01) |
| H01L 29/10 | (2006.01) |
| H01L 21/8234 | (2006.01) |
| H01L 29/04 | (2006.01) |

(52) U.S. Cl.
CPC .. *H01L 27/0629* (2013.01); *H01L 21/823487* (2013.01); *H01L 29/045* (2013.01); *H01L 29/1033* (2013.01); *H01L 29/66666* (2013.01); *H01L 29/7827* (2013.01)

(58) Field of Classification Search
CPC .................................................. H01L 27/0629
See application file for complete search history.

(56) References Cited

U.S. PATENT DOCUMENTS

| 7,713,822 | B2 | 5/2010 | Thorup et al. |
| 7,799,591 | B2 | 9/2010 | Fujimoto |
| 8,450,713 | B2 | 5/2013 | Awaya et al. |
| 8,580,636 | B2 | 11/2013 | Kwon et al. |
| 8,669,613 | B2 | 3/2014 | Lui et al. |
| 8,809,139 | B2 * | 8/2014 | Huang ............ H01L 21/823807 257/E21.176 |
| 9,041,173 | B2 | 5/2015 | Mizukami |
| 9,240,355 | B2 | 1/2016 | Cheng et al. |
| 9,391,204 | B1 * | 7/2016 | Cheng .................. H01L 29/785 |

* cited by examiner

*Primary Examiner* — Marc Armand
(74) *Attorney, Agent, or Firm* — Tutunjian & Bitetto, P.C.; Vazken Alexanian

(57) ABSTRACT

A method of forming a vertical finFET and vertical diode device on the same substrate, including forming a channel layer stack on a heavily doped layer; forming fin trenches in the channel layer stack; oxidizing at least a portion of the channel layer stack inside the fin trenches to form a dummy layer liner; forming a vertical fin in the fin trenches with the dummy layer liner; forming diode trenches in the channel layer stack; oxidizing at least a portion of the channel layer stack inside the diode trenches to form a dummy layer liner; forming a first semiconductor segment in a lower portion of the diode trenches with the dummy layer liner; and forming a second semiconductor segment in an upper portion of the diode trenches with the first semiconductor segment, where the second semiconductor segment is formed on the first semiconductor segment to form a p-n junction.

14 Claims, 13 Drawing Sheets

CO-FABRICATION OF VERTICAL DIODES AND FIN FIELD EFFECT TRANSISTORS ON THE SAME SUBSTRATE

BACKGROUND

Technical Field

The present invention relates to co-fabricating a vertical field effect transistor (VFET) structure with a vertical diode, and more particularly to the co-integration of a VFET and companion p-n vertical diode on the same substrate.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and finFETs have been formed with the channel extending outward from the substrate, but where the current also flows horizontally from a source to a drain. The channel for the finFET can be an upright slab of thin rectangular Si, commonly referred to as the fin with a gate on the fin, as compared to a MOSFET with a single gate in the plane of the substrate. Depending on the doping of the source and drain, an n-FET or a p-FET may be formed.

Examples of FETs can include a metal-oxide-semiconductor field effect transistor (MOSFET) and an insulated-gate field-effect transistor (IGFET). Two FETs also may be coupled to form a complementary metal oxide semiconductor (CMOS), where a p-channel MOSFET and n-channel MOSFET are coupled together.

As MOSFETs are scaled to smaller dimensions, designs and techniques are employed to improve device performance. Vertical transistors are attractive candidates for scaling to smaller dimensions. In vertical transistors, the source/drain regions are arranged on opposing ends of a vertical channel region. Vertical transistors may provide higher density scaling and allow for relaxed gate lengths to better control device electrostatics without sacrificing the gate contact pitch size.

SUMMARY

A method of forming a vertical fin field effect transistor (finFET) and a vertical diode device on the same substrate includes forming a channel layer stack on a heavily doped layer; forming one or more fin trenches in the channel layer stack; oxidizing at least a portion of the channel layer stack inside the one or more fin trenches to form a dummy layer liner; forming a vertical fin in at least one of the one or more fin trenches with the dummy layer liner; forming one or more diode trenches in the channel layer stack; oxidizing at least a portion of the channel layer stack inside the one or more diode trenches to form a dummy layer liner; forming a first semiconductor segment in a lower portion of at least one of the one or more diode trenches with the dummy layer liner; and forming a second semiconductor segment in an upper portion of the at least one of the one or more diode trenches with the first semiconductor segment, where the second semiconductor segment is formed on the first semiconductor segment to form a p-n junction.

A method of forming a vertical finFET and a vertical diode device on the same substrate includes forming a counter-doped layer on a substrate and a heavily doped layer on the counter-doped layer; forming a bottom spacer layer on the heavily doped layer; forming a dummy gate layer on the bottom spacer layer; forming a top spacer layer on the dummy gate layer; forming one or more fin trenches, where at least one of the one or more fin trenches passes through the top spacer layer, the dummy gate layer, and the bottom spacer layer; oxidizing at least a portion of the exposed portion of the dummy gate layer inside the one or more fin trenches to form a dummy layer liner; forming a vertical fin in at least one of the one or more fin trenches with the dummy layer liner; forming one or more diode trenches, where at least one of the one or more diode trenches passes through the top spacer layer, the dummy gate layer, and the bottom spacer layer; oxidizing at least a portion of the exposed portion of the dummy gate layer inside the one or more diode trenches to form a dummy layer liner; forming a first semiconductor segment in a lower portion of at least one of the one or more diode trenches with the dummy layer liner; and forming a second semiconductor segment in an upper portion of the at least one of the one or more diode trenches with the first semiconductor segment, where the second semiconductor segment is formed on the first semiconductor segment to form a p-n junction.

A vertical finFET and a vertical diode device on the same substrate, including a vertical fin formed on a heavily doped layer, where the heavily doped region forms a source/drain; a bottom spacer layer on the heavily doped layer and adjacent the sidewall of the vertical fin; a high-K dielectric layer on at least a portion of the sidewalls of the vertical fin; a work function layer on the high-K dielectric layer on the portion of the sidewall of the vertical fin; a gate metal layer on at least a portion of the work function layer; a first semiconductor segment on the heavily doped layer; and a second semiconductor segment on the first semiconductor segment, where the interface between the second semiconductor segment and the first semiconductor segment is a p-n junction.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
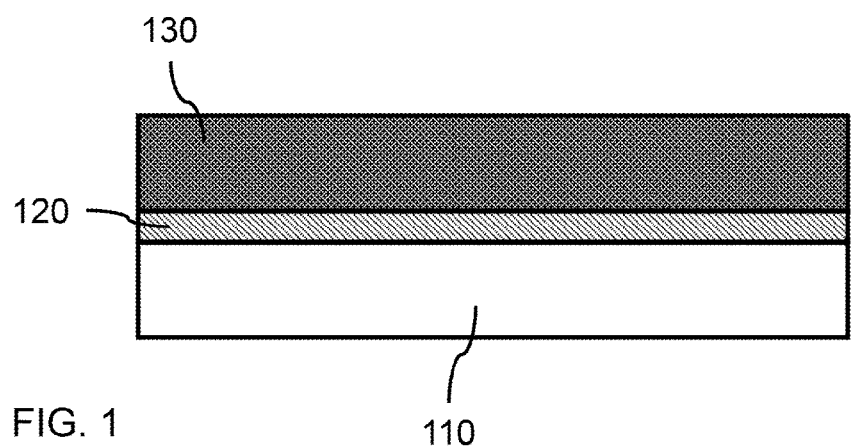
FIG. 1, which is a cross-sectional side view of a substrate in accordance with an exemplary embodiment.

Principles and embodiments of the present disclosure relate generally to a channel last fabrication approach to form a vertical field effect transistor (VFET), or more specifically a vertical finFET, where current flows vertically through the channel, and a vertical p-n diode on the same substrate. The vertical finFET and vertical diode may be epitaxially grown on a coterminous region of a substrate surface implementing various fabrication processes.

Principles and embodiments also relate to forming one or more vertical fin field effect transistor (vertical finFETs) and one or more vertical diodes, wherein at least a portion of the vertical diode and the channel portion of the finFET(s) are epitaxially grown from the same substrate surface. The one or more vertical fin(s) and one or more vertical diode(s) may be formed in trenches etched into the same channel layer stack on a substrate.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGs. It will be understood that the spatially relative terms are intended to encompass different orientations of the device in use or operation in addition to the orientation depicted in the FIGs. For example, if the device in the FIGs. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

While exemplary embodiments have been shown for a particular device, it should be understood that a plurality of such devices may be arranged and/or fabricated on a substrate to form integrated devices that may be integrated onto a substrate, for example through very large scale integration to produce complex devices such a central processing units (CPUs) and application specific integrated circuits (ASICs). The present embodiments may be part of a device or circuit, and the circuits as described herein may be part of a design for an integrated circuit chip.

Referring now to the drawings in which like numerals represent the same or similar elements and initially to FIG. 1, which is a cross-sectional side view of a substrate in accordance with an exemplary embodiment.

In one or more embodiments, a substrate 110 may be a semiconductor. The substrate may be crystalline. The substrate may be essentially (i.e., except for contaminants) a single element (e.g., silicon), primarily of a single element (i.e., with doping), for example, silicon (Si) or germanium (Ge), or the substrate may be a compound semiconductor, for example, a III-V compound semiconductor (e.g., GaAs), SiC, or SiGe. The substrate may also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). In one or more embodiments, the substrate 110 may be a silicon wafer. In various embodiments, the substrate is a single crystal silicon wafer. A single crystal silicon substrate may have a <100> or a <111> surface, which may be used for epitaxial growth of a FET channel and/or a diode.

In one or more embodiments, a counter-doped layer 120 may be formed on or within the substrate 110, where the counter-doped layer 120 may be used to electrically isolate a source/drain region from the bulk of a substrate. The counter-doped layer 120 may be n-doped or p-doped.

In one or more embodiments, a heavily doped layer 130 may be formed on the counter-doped layer 120. The heavily doped layer 130 may be n-doped or p-doped. The heavily doped layer 130 may have a dopant concentration in the range of about $1 \times 10^{19}$ to about $1 \times 10^{22}$ dopant atoms/cm$^3$. In various embodiments, the heavily doped layer 130 may form a source or a drain of a finFET, and/or an anode/cathode of a diode. It should be noted that a source and a drain may be interchanged, where the drain may be in the substrate below a vertical fin and the source may be formed on the top of a vertical fin. An anode and cathode of a diode may be interchanged based on the doping of the diode segments.

In one or more embodiments, the counter-doped layer 120 and the heavily doped layer 130 may each be in-situ doped during epitaxial growth on a single crystal substrate. In various embodiments, dopants may be ion implanted into the counter-doped layer 120 and/or the heavily doped layer 130. The counter-doped layer 120 may include dopants of an opposite type relative to the heavily doped layer 130 to provide a depletion layer at the interface of the counter-doped layer 120 and the heavily doped layer 130.

Figure 2:
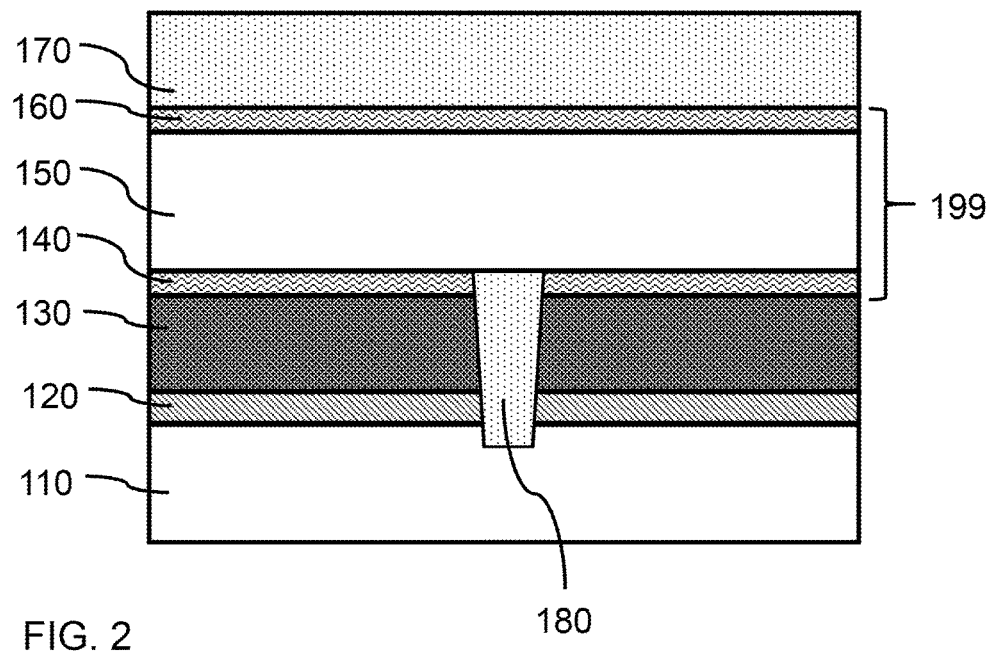
FIG. 2 is a cross-sectional side view of a substrate with a bottom spacer layer, a dummy gate layer, a top spacer, and an oxide layer, on a heavily doped layer in accordance with an exemplary embodiment.

FIG. 2 is a cross-sectional side view of a substrate with a bottom spacer layer, a dummy gate layer, a top spacer layer, and an oxide layer, on a heavily doped layer in accordance with an exemplary embodiment.

In one or more embodiments, a bottom spacer layer 140 may be formed on a exposed surface of the substrate heavily doped layer 130. The bottom spacer layer 140 may be a dielectric material other than a high-K dielectric, for example, silicon oxide (SiO), silicon nitride (SiN), or boron nitride (BN). The bottom spacer layer 140 may be deposited by chemical vapor deposition (CVD), physical layer deposition (PVD), atomic layer deposition (ALD), as well as modifications thereof, such as plasma enhanced (e.g., PECVD), metal organic (e.g., MOCVD), electron beam (e.g., EB-PVD), low pressure (e.g., LPCVD), etc., or combinations thereof. The bottom spacer layer 140 may act as an etch stop layer during fabrication processes.

In one or more embodiments, the bottom spacer layer 140 may have a thickness in the range of about 2 nm to about 10 nm, or in the range of about 2 nm to about 5 nm. The thickness of the bottom spacer layer 140 may define the distance of a bottom edge of a gate structure from the heavily doped layer 130.

In various embodiments, a trench may be formed in the bottom spacer layer 140, heavily doped layer 130, and through the counter-doped layer 120 into a portion of the substrate 110. The trench may be filled with a dielectric, insulating material to provide shallow trench isolation (STI) regions 180 between neighboring regions of the heavily doped layer 130. The STI region 180 may electrically isolate different regions of the heavily doped layer 130 that may form bottom source/drain regions of a vertical finFET and/or bottom anode/cathode regions of a vertical diode. In various embodiments, the trench is filled with silicon oxide (SiO) to form the STI region 180. The SiO fill of the STI region 180 and the bottom spacer layer 140 may be chemically-mechanically polished prior to the formation of subsequent layers on the bottom spacer layer 140 to provide a uniform flat surface.

In one or more embodiments, a dummy gate layer 150 may be formed on the bottom spacer layer 140 and a STI region 180, which may provide a sacrificial template for forming a vertical channel, a gate structure on a channel, and/or a diode structure. In various embodiments, the dummy gate layer 150 may be amorphous silicon (a-Si) or polycrystalline silicon (p-Si).

In one or more embodiments, the dummy gate layer 150 may have a thickness in the range of about 10 nm to about 100 nm, or in the range of about 10 nm to about 50 nm, or in the range of about 10 nm to about 20 nm.

In one or more embodiments, a top spacer layer 160 may be formed on the dummy gate layer 150, where the top spacer layer 160 may be the same material as the bottom spacer layer 140. The top spacer layer 160 may be a dielectric material other than a high-K metal oxide dielectric, for example, silicon oxide (SiO), silicon nitride (SiN), silicon oxynitride (SiON), or boron nitride (BN).

In one or more embodiments, the top spacer layer 160 may have a thickness in the range of about 2 nm to about 10 nm, or in the range of about 2 nm to about 5 nm. The top spacer layer 160 may have a different thickness than the bottom spacer layer 140.

The bottom spacer layer 140, dummy gate layer 150, and top spacer layer 160 may form a channel layer stack 199, where the channel layer stack may provide a template for defining a vertical channel and/or forming a gate structure.

In one or more embodiments, an oxide layer 170 may be formed on the top spacer layer 160, where the oxide layer 170 may be a sacrificial layer blanket deposited on the top spacer layer 160. The oxide layer 170 may be silicon oxide (SiO), which may be formed by a CVD deposition or a PVD deposition. The oxide layer 170 may be a different material than the top spacer layer 160, such that the top spacer layer 160 may act as an etch stop layer.

Figure 3:
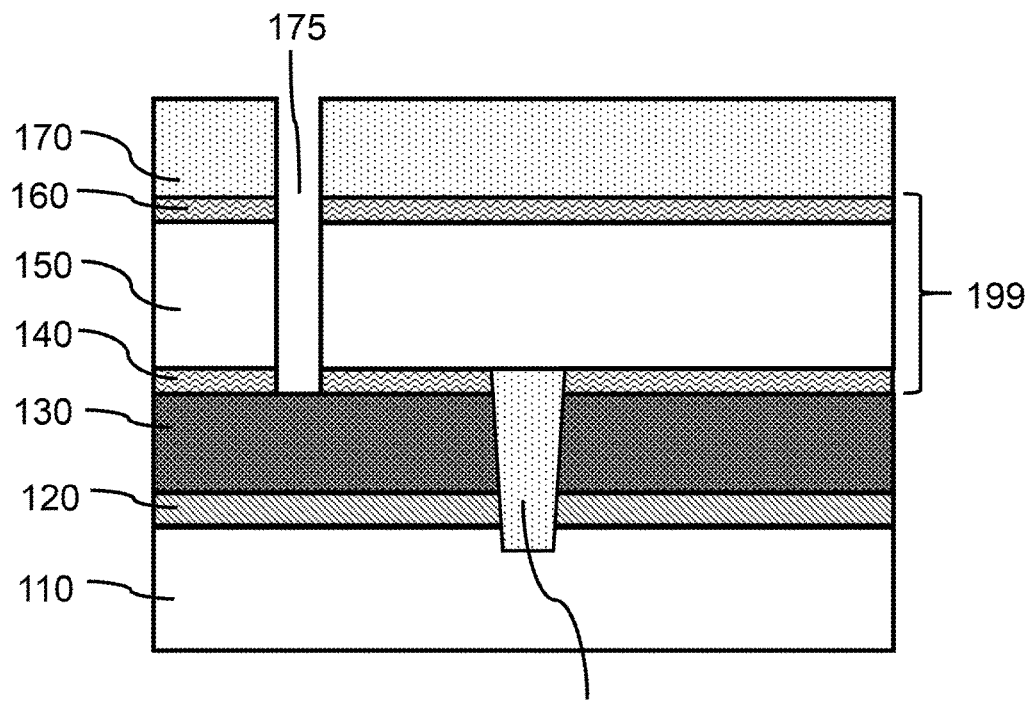
FIG. 3 is a cross-sectional side view of a trench from the oxide layer to the surface of the heavily doped layer in accordance with an exemplary embodiment.

FIG. 3 is a cross-sectional side view of a trench from the oxide layer to the surface of the heavily doped layer in accordance with an exemplary embodiment.

In various embodiments, a photo mask layer may be a temporary resist (e.g., PMMA) that may be deposited on the oxide layer 170, patterned, and developed. The photo mask layer may be a positive resist or a negative resist. One or more openings may be patterned in the photo mask layer for forming one or more fin trenches 175 through the oxide layer 170 and in the channel layer stack 199. The size and placement of the openings in the photo mask layer may define the width, length, and pitch of the one or more openings, and thereby, the width, length, and pitch of the one or more vertical fins.

In one or more embodiments, one or more suitable etching processes may be utilized to remove material from the oxide layer 170, top spacer layer 160, dummy gate layer 150, and bottom spacer layer 140, to form a fin trench 175, where the underlying material may act as an etch stop layer for each of the one or more etching processes sequentially utilized to form the fin trench(es) 175. In various embodiments, the fin trenches 175 may be etched using a directional reactive ion etching (RIE) process.

In one or more embodiments, the openings in the photo mask layer may have a width in the range of about 6 nm to about 20 nm, or may have a width in the range of about 8 nm to about 15 nm, or may have a width in the range of about 10 nm to about 12 nm. The trenches 175 may have a width in the range of about 6 nm to about 20 nm, or may have a width in the range of about 8 nm to about 15 nm, or may have a width in the range of about 10 nm to about 12 nm, and a depth in the range of about 30 nm to about 300 nm, or a depth in the range of about 50 nm to about 150 nm.

Figure 4:
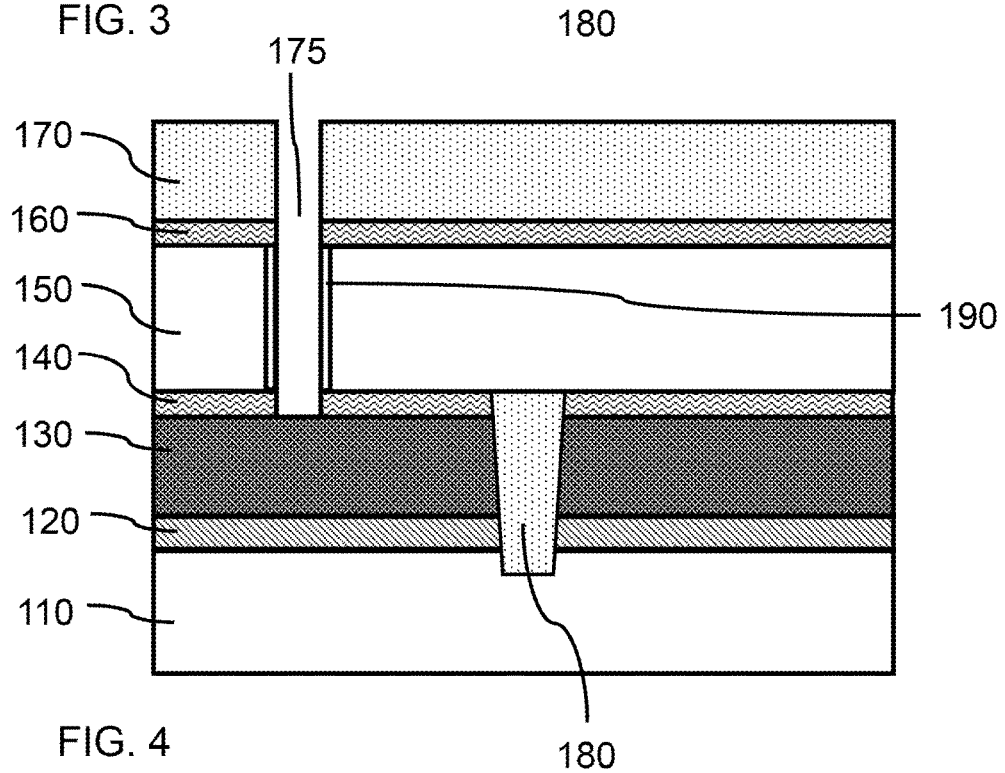
FIG. 4 is a cross-sectional side view of a trench with the dummy gate layer having an oxidized inner surface in accordance with an exemplary embodiment.

FIG. 4 is a cross-sectional side view of a trench with the dummy gate layer having an oxidized inner surface in accordance with an exemplary embodiment.

In one or more embodiments, after formation of the one or more fin trench(es) 175, at least a portion of the channel layer stack 199 inside the one or more fin trenches 175 may be oxidized to form a dummy layer liner 190. In various embodiments, the oxide layer 170, top spacer layer 160, dummy gate layer 150, and bottom spacer layer 140 may be exposed to oxidation, where the exposed portion of the dummy gate layer 150 inside the fin trench 175 may be oxidized to form a dummy layer liner 190. The dummy layer liner 190 may surround the trench 175 at the level of the dummy gate layer. The dummy layer liner may protect the interface between the vertical fin and the dummy gate layer during epitaxial growth and/or subsequent processes, where the dummy layer liner may avoid an amorphous crystal structure of the dummy gate layer interfering with the epitaxial growth.

In various embodiments, the dummy layer liner 190 may be formed by plasma oxidation or thermal oxidation of the sidewalls of the dummy gate layer 150 within the fin trench 175. In various embodiments, thermal oxidation may be done using an oxidizing gas (e.g., $O_2$, $O_3$, etc.) at temperatures in the range of about 600° C. to about 1200° C. The oxidation of the dummy gate layer material (e.g., a-Si) may form $SiO_2$.

In various embodiments, the sidewalls of the dummy gate layer 150 within the fin trenches 175 may be oxidized after extending the fin trenches 175 through the bottom spacer layer 140 to the surface of the heavily doped layer 130. In various embodiments, a trench may be etched all the way down to the heavily doped layer, then an oxide layer may be grown on the exposed surface of the dummy gate layer 150 inside the trench by a plasma oxidation, where the oxide grows selectively only on the dummy gate layer material to form a dummy layer liner 190.

Figure 5:
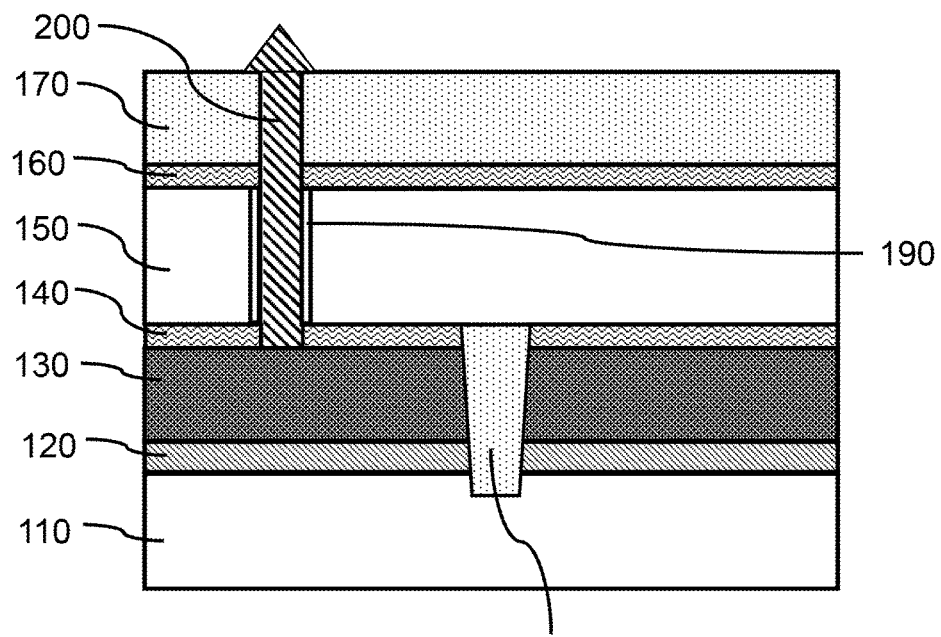
FIG. 5 is a cross-sectional side view of a vertical fin formed in a fin trench on the substrate in accordance with an exemplary embodiment.

FIG. 5 is a cross-sectional side view of a vertical fin formed in a fin trench on the substrate in accordance with an exemplary embodiment.

In one or more embodiments, a vertical fin 200 may be formed within each of the one or more fin trenches 175 formed in the oxide layer 170 and channel layer stack 199. The one or more vertical fins 200 may be formed by epitaxial growth from the exposed surface of the heavily doped layer 130. In various embodiments, the heavily doped layer 130 may have a <100> or <111> crystal orientation, and the vertical fins 200 may be formed with the same crystal orientation as the heavily doped layer 130. The heavily doped layer 130 may have the same crystal orientation as the bulk substrate or an active layer on an SeOI substrate. In various embodiments, the top surface of the vertical fins 200 may have a <100> crystal orientation. By forming the vertical fin(s) 200 on the heavily doped layer 130, the source-channel junction is self-aligned at the common interface.

In various embodiments, the one or more vertical fins 200 are formed on the heavily doped layer 130, where regions of the heavily doped layer may be isolated by STI region 180, wherein the heavily doped region in the substrate may act as a source or a drain for a VFET, and the vertical fins 200 act as a channel for the VFET.

In one or more embodiments, the vertical fins 200 may be silicon, (Si), germanium (Ge), silicon-germanium (SiGe), gallium arsenide (GaAs), indium gallium arsenide (InGaAs), indium arsenide (InAs), or indium aluminum arsenide (InAlAs). The vertical fins 200 may be single crystal epitaxially grown on the heavily doped layer 130. The vertical fins 200 may extend above the surface of the oxide layer 170 and expand laterally due to different growth rates of the different crystal faces.

In one or more embodiments, the one or more vertical fins 200 may have a width in the range of about 6 nm to about 20 nm, or may have a width in the range of about 8 nm to about 15 nm, or may have a width in the range of about 10 nm to about 12 nm, and a length in the range of about 30 nm to about 300 nm, or about 50 nm to about 150 nm.

Figure 6:
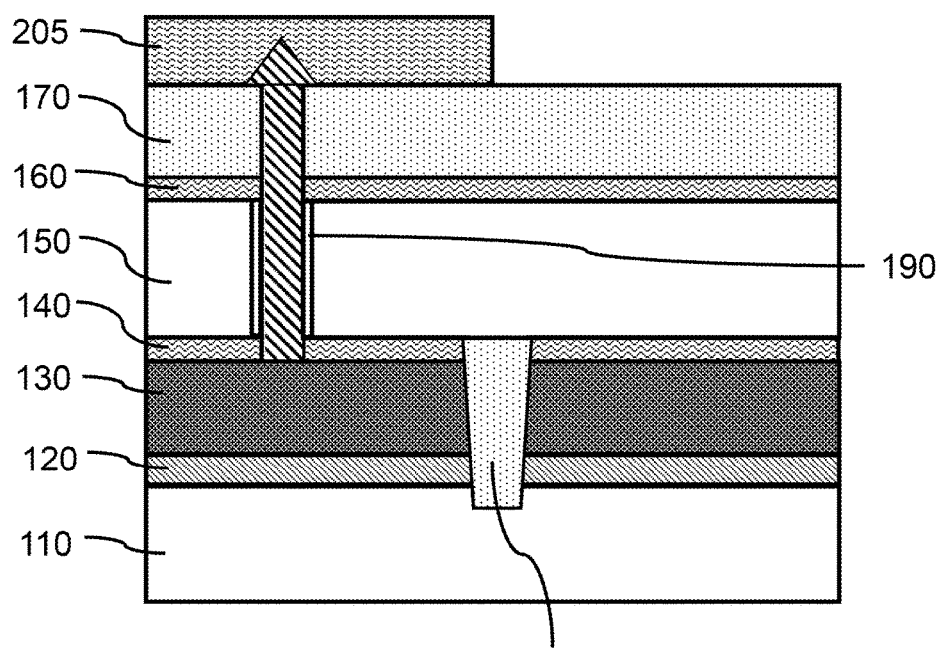
FIG. 6 is a cross-sectional side view of a hardmask on a top portion of a vertical fin and oxide layer in accordance with an exemplary embodiment.

FIG. 6 is a cross-sectional side view of a hardmask on a top portion of a vertical fin and oxide layer in accordance with an exemplary embodiment.

In one or more embodiments, a hardmask 205 may be formed over at least the exposed portion of one or more vertical fins 200, where the hardmask 205 may cover a portion of the top surface of the oxide layer 170. The hardmask 205 may be formed on the portion of the vertical fin(s) 200 extending above the surface of the oxide layer 170, and may cover a portion of the oxide layer 170 surrounding the portion of the vertical fin(s) 200. The hardmask 205 may be selectively formed on the exposed portion of one or more vertical fins 200, while portions of the oxide layer 170 remain exposed for forming additional trenches for formation of one or more diode structures. In various embodiments, the hardmask may be silicon nitride.

Figure 7:
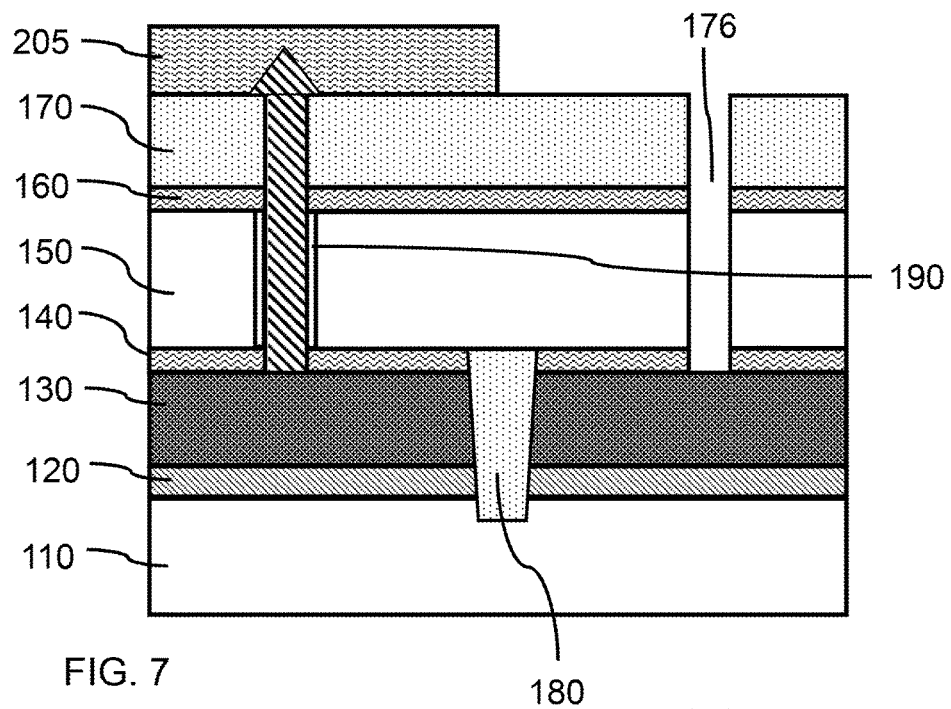
FIG. 7 is a cross-sectional side view of a hardmask over a vertical fin, and a trench from the oxide layer to the surface of the heavily doped layer in accordance with an exemplary embodiment.

FIG. 7 is a cross-sectional side view of a hardmask over a vertical fin, and a trench from the oxide layer to the surface of the heavily doped layer in accordance with an exemplary embodiment.

In one or more embodiments, the hardmask 205 covers a portion of the oxide layer 170, and a diode trench 176 may be formed through the exposed surface of the oxide layer 170. A photomask layer may be formed and patterned on the exposed portion of the oxide layer 170. One or more openings may be patterned in the photo mask layer for forming one or more diode trenches 176 through the oxide layer 170 and in the channel layer stack 199. The size and placement of the openings in the photo mask layer may define the width, length, and pitch of the one or more openings, and thereby, the width, length, and pitch of the one or more diode structures.

In one or more embodiments, one or more suitable etching processes may be utilized to remove material from the oxide layer 170, top spacer layer 160, dummy gate layer 150, and bottom spacer layer 140, to form a diode trench 176, where the underlying material may act as an etch stop layer for each of the one or more etching processes sequentially utilized to form the fin trench(es) 175. In various embodiments, the fin trenches 175 may be etched using a directional reactive ion etching (RIE) process.

Figure 8:
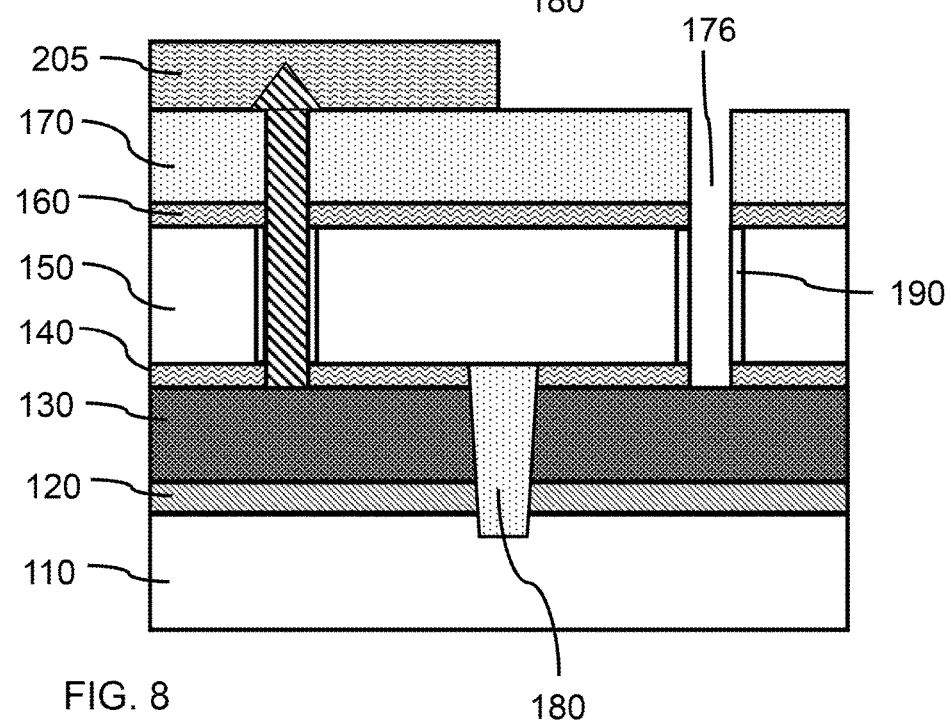
FIG. 8 is a cross-sectional side view of a vertical fin and a diode trench with an oxidized inner surface in accordance with an exemplary embodiment.

FIG. 8 is a cross-sectional side view of a vertical fin and a diode trench with an oxide liner in accordance with an exemplary embodiment.

In one or more embodiments, after formation of the one or more diode trench(es) 176, at least a portion of the channel layer stack 199 inside the one or more diode trenches 176 may be oxidized to form a dummy layer liner 190. In various embodiments, the oxide layer 170, top spacer layer 160, dummy gate layer 150, and bottom spacer layer 140 may be exposed to oxidation, where the exposed portion of the dummy gate layer 150 may be oxidized to form a dummy layer liner 190. The dummy layer liner 190 may surround the trench 175.

In various embodiments, the dummy layer liner 190 may be formed by plasma oxidation or thermal oxidation of the sidewalls of the dummy gate layer 150 within the diode trench 176. In various embodiments, thermal oxidation may be done using an oxidizing gas (e.g., $O_2$, $O_3$, etc.) at temperatures in the range of about 600° C. to about 1200° C. The oxidation of the dummy gate layer material (e.g., a-Si) may form $SiO_2$.

Figure 9:
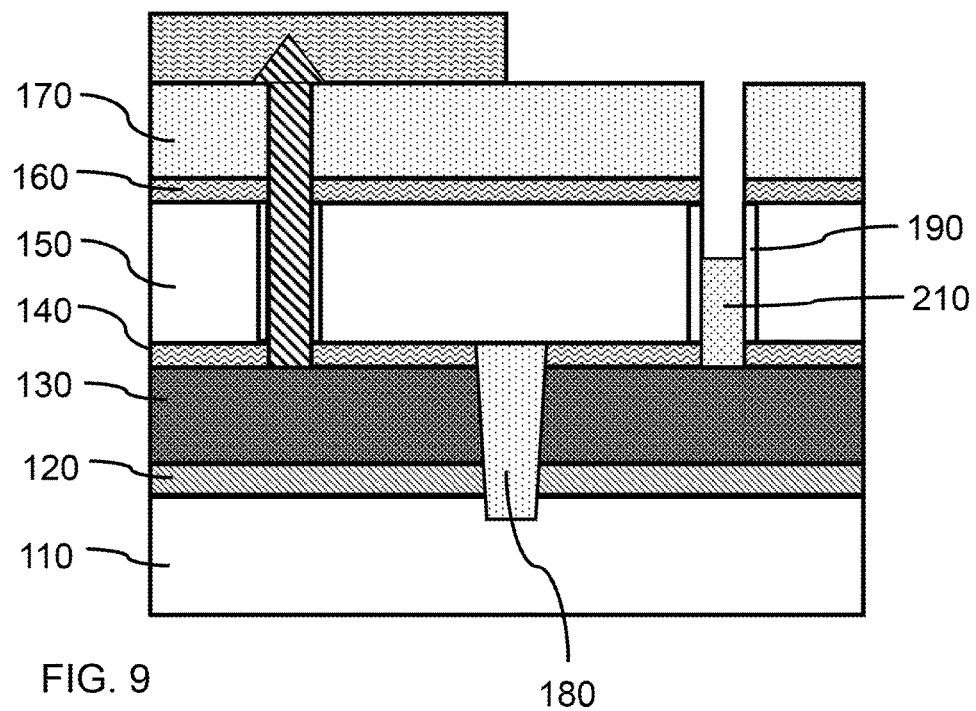
FIG. 9 is a cross-sectional side view of a vertical fin and a diode trench with a first semiconductor segment in accordance with an exemplary embodiment.

FIG. 9 is a cross-sectional side view of a vertical fin and a diode trench with a first semiconductor segment in accordance with an exemplary embodiment.

In one or more embodiments, first semiconductor segment 210 may be formed in a lower portion of diode trench of each of the one or more diode trenches 176 formed in the oxide layer 170 and channel layer stack 199. The one or more first semiconductor segment(s) 210 may be formed by epitaxial growth from the exposed surface of the heavily doped layer 130. In various embodiments, the heavily doped layer 130 may have a <100> or <111> crystal orientation, and the first semiconductor segments 210 may be formed with the same crystal orientation as the heavily doped layer 130. The heavily doped layer 130 may have the same crystal orientation as the bulk substrate or an active layer on an SeOI substrate. The heavily doped layer 130 may form a bottom anode/cathode for the first semiconductor segment 210. In various embodiments, the top surface of the first semiconductor segment 210 may have a <100> crystal orientation. By forming the first semiconductor segment 210 on the heavily doped layer 130, the junction is self-aligned at the common interface.

In one or more embodiments, the first semiconductor segment 210 may have height less than the depth of the diode trench 176, such that the top of the first semiconductor segment 210 may be below the bottom surface of the top spacer layer 160. In various embodiments, the first semiconductor segment 210 may be epitaxially gown to a height in the range of about one third to about two-thirds of the dummy gate layer thickness, or to a height approximately to the midpoint of the dummy gate layer 150.

In one or more embodiments, first semiconductor segment 210 may be an n-doped or p-doped semiconductor, where the first semiconductor segment 210 has the same doping as the heavily doped layer 130. Having the first semiconductor segment 210 with the same doping as the heavily doped layer 130 may avoid creating a junction or non-ohmic contact between the heavily doped layer 130 and the first semiconductor segment 210. The second semiconductor segment 220 may be an n-doped or p-doped semiconductor, where the second semiconductor segment 220 has the opposite doping as the first semiconductor segment 210 to form a p-n junction for a vertical diode. In various embodiments, the second semiconductor segment 220 has the opposite doping as the heavily doped layer 130.

Figure 10:
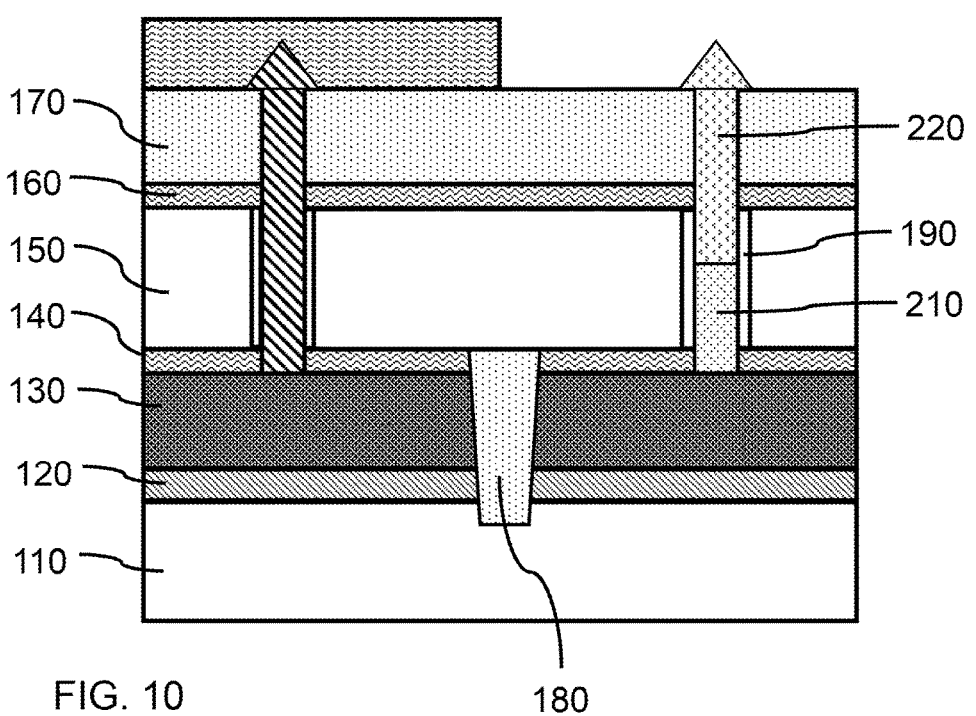
FIG. 10 is a cross-sectional side view of a vertical fin and a diode trench with a first semiconductor segment and a second semiconductor segment in accordance with an exemplary embodiment.

FIG. 10 is a cross-sectional side view of a vertical fin and a diode trench with a first semiconductor segment and a second semiconductor segment in accordance with an exemplary embodiment.

In one or more embodiments, a second semiconductor segment 220 may be formed in an upper portion of each of the one or more diode trenches 176 formed in the oxide layer 170 and channel layer stack 199. The second semiconductor segment 220 may be formed on the top surface of the first second semiconductor segment 210, where the second semiconductor segment 220 may be formed by epitaxial growth on the first semiconductor segment 210. The second semiconductor segment 220 may be formed with the same crystal orientation as the first semiconductor segments 210. In various embodiments, the top surface of the second semiconductor segment 220 may have a <100> crystal orientation.

The second semiconductor segment 220 may extend above the surface of the oxide layer 170, and expand laterally due to different growth rates of the crystal faces.

In one or more embodiments, the first semiconductor segments 210 and second semiconductor segments 220 may have a width in the range of about 6 nm to about 20 nm, or may have a width in the range of about 8 nm to about 15 nm, or may have a width in the range of about 10 nm to about 12 nm, and a combined height in the range of about 30 nm to about 300 nm, or a height in the range of about 50 nm to about 150 nm.

In one or more embodiments, the first semiconductor segment 210 and second semiconductor segment 220 in the same diode trench form a p-n junctions at the interface of the first semiconductor segment 210 and second semiconductor segment 220. The first semiconductor segment 210 and second semiconductor segment 220 may form a diode in each of the one or more diode trenches 176.

Figures 11, 12:
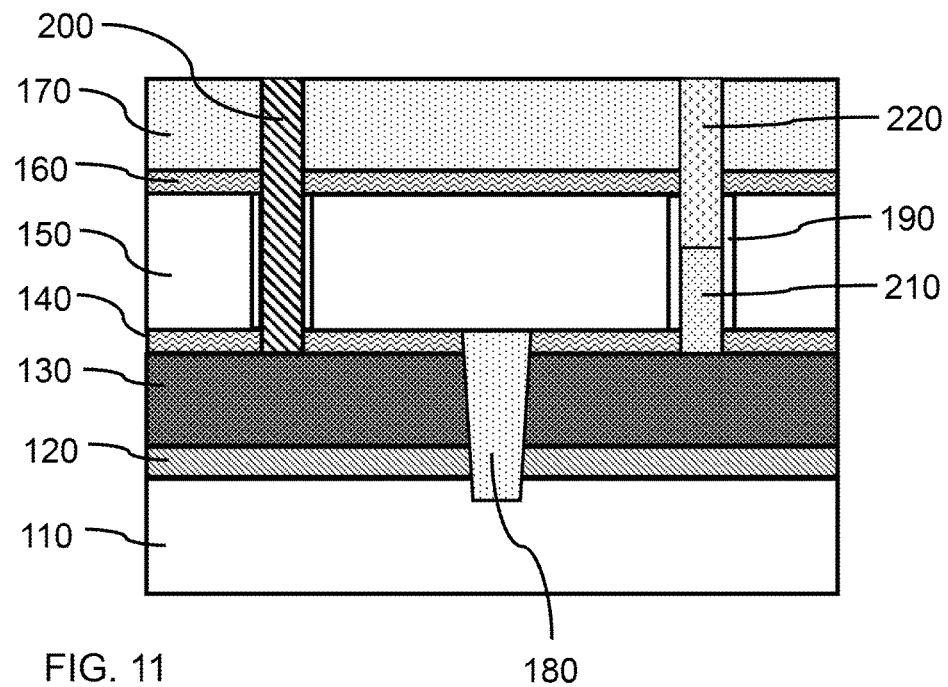
FIG. 11 is a cross-sectional side view of a vertical fin, a vertical diode, and an oxide layer having a flat surface in accordance with an exemplary embodiment.
FIG. 12 is a cross-sectional side view of a recessed vertical fin and second semiconductor segment in accordance with an exemplary embodiment.

FIG. 11 is a cross-sectional side view of a vertical fin, a vertical diode, and an oxide layer having a flat surface in accordance with an exemplary embodiment.

In one or more embodiments, a portion of the oxide layer 170 and the portions of the vertical fin(s) 200 and second semiconductor segments 220 extending above the top surface of the oxide layer 170 may be removed to provide a uniform flat surface. In various embodiments, the portions of the vertical fin(s) 200 and second semiconductor segments 220 extending above the top surface of the oxide layer 170, as well as a portion of the oxide layer 170, may be removed by CMP.

FIG. 12 is a cross-sectional side view of a recessed vertical fin and second semiconductor segment in accordance with an exemplary embodiment.

In one or more embodiments, a fraction of a vertical fin 200 and/or second semiconductor segment 220 may be removed from an upper portion of fin trench 175 and/or diode trench 176 respectively to form recess(es) 178. In various embodiments, the height of the vertical fin 200 may be reduced, such that the top surface of the vertical fin 200 is below the top surface of the oxide layer 170 but above the top surface of the top spacer layer 160. In various embodiments, the height of the second semiconductor segment 220 may be reduced, such that the top surface of the second semiconductor segment 220 is below the top surface of the oxide layer 170 but above the top surface of the top spacer layer 160.

In various embodiments, the fraction of a vertical fin 200 and/or second semiconductor segment 220 may be removed by a selective etch, where the selective etch may be a wet etch or a blanket RIE.

Figure 13:
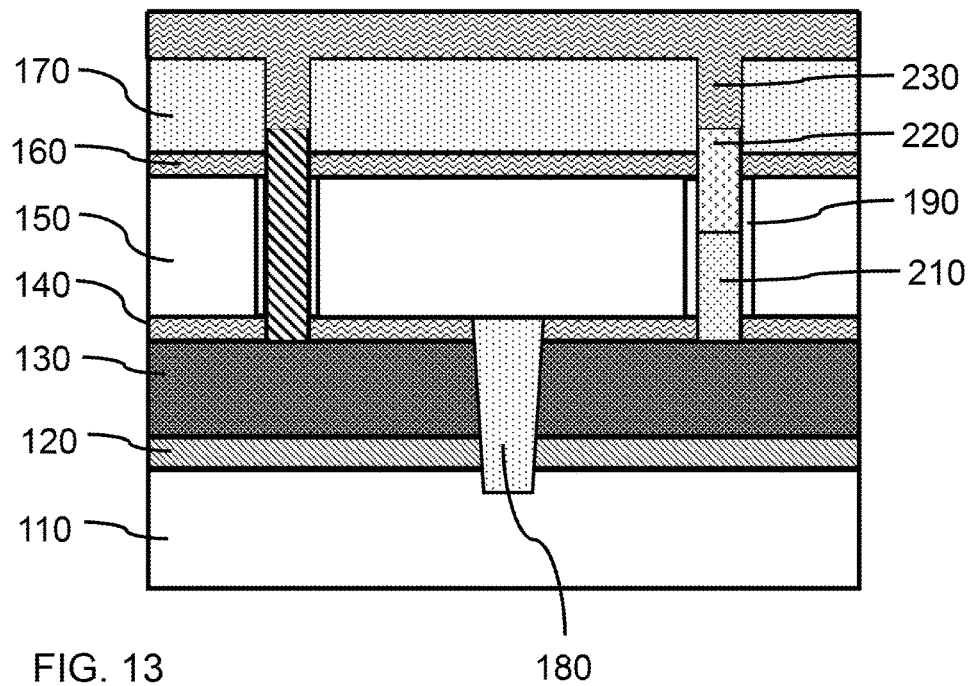
FIG. 13 is a cross-sectional side view of a nitride fill in the trench recesses in accordance with an exemplary embodiment.

FIG. 13 is a cross-sectional side view of a nitride fill in the trench recesses in accordance with an exemplary embodiment.

In one or more embodiments, a nitride fill 230 may be formed in at least the one or more recesses 178 formed in the trenches, where the nitride fill may be silicon nitride. The nitride fill may extend above the top of the recesses and form at least a partial layer over oxide layer 170.

Figure 14:
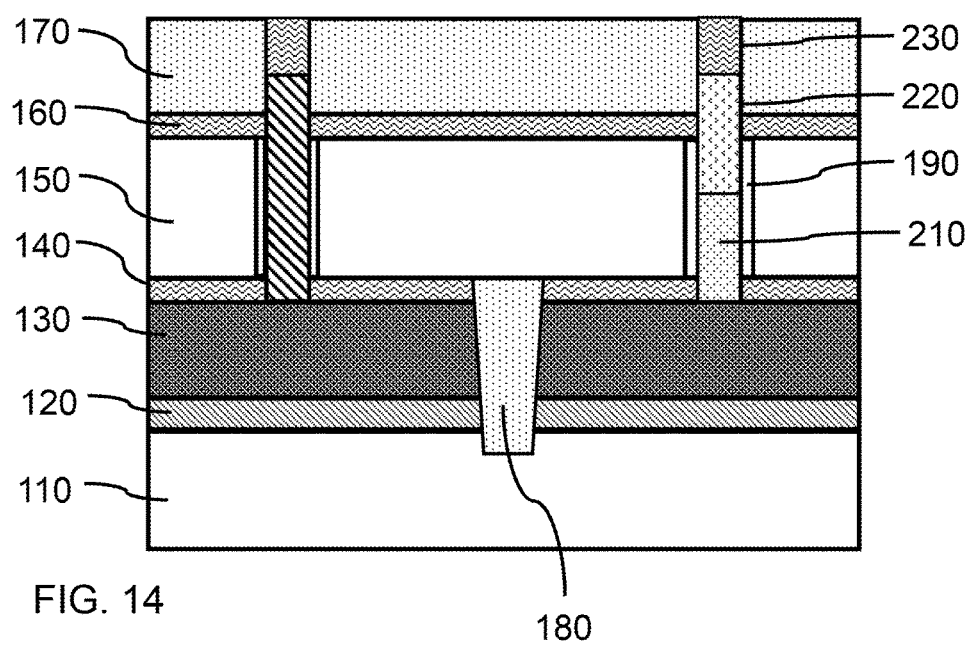
FIG. 14 is a cross-sectional side view of a nitride fill in accordance with an exemplary embodiment.

FIG. 14 is a cross-sectional side view of a nitride fill in accordance with an exemplary embodiment.

In one or more embodiments, after formation of the nitride fill 230, the portion of the nitride fill extending above the top surface of the oxide layer 170 may be removed, where the nitride fill 230 may be removed by CMP.

Figure 15:
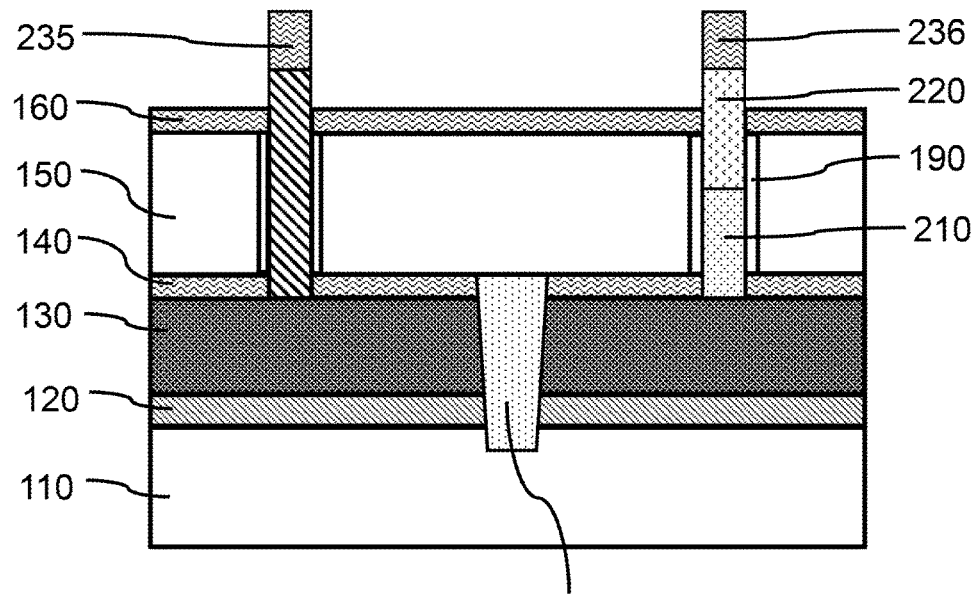
FIG. 15 is a cross-sectional side view of a partially removed organic planarization layer, nitride layer, and work function layer in accordance with an exemplary embodiment.

FIG. 15 is a cross-sectional side view of a partially removed organic planarization layer, nitride layer, and work function layer in accordance with an exemplary embodiment.

In one or more embodiments, the oxide layer 170 above the top spacer layer 160 may be selectively removed to expose at least an upper portion of a vertical fin and at least an upper portion of a second semiconductor segment. The nitride caps 235, 236 may also be exposed by removal of the oxide layer 170. In various embodiments, the oxide layer may be removed by a wet etch and/or a blanket RIE.

Figure 16:
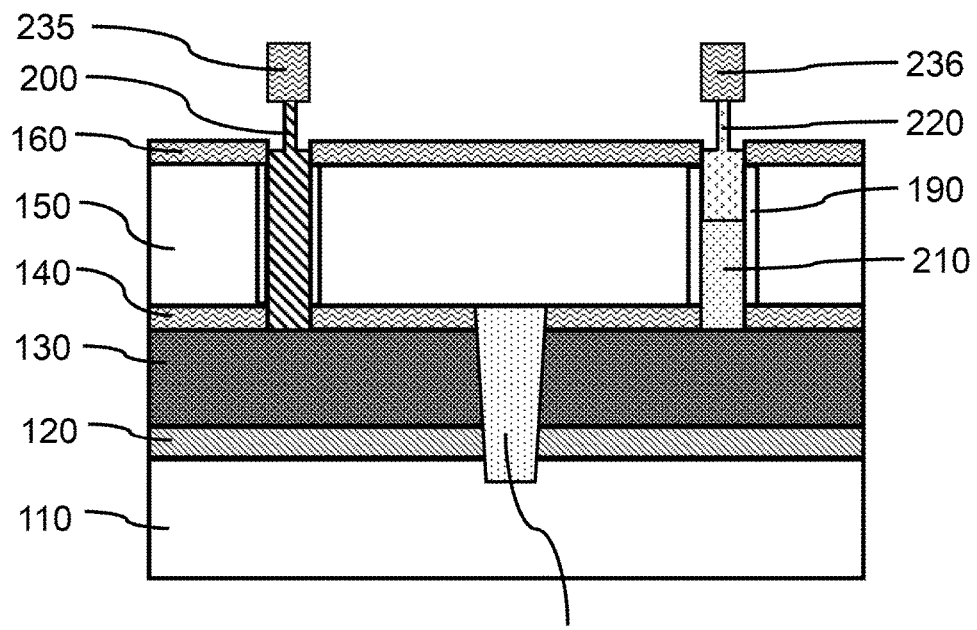
FIG. 16 is a cross-sectional side view of a vertical fin with a thinned portion and a second semiconductor segment with a thinned portion in accordance with an exemplary embodiment.

FIG. 16 is a cross-sectional side view of a vertical fin with a thinned portion and a second semiconductor segment with a thinned portion in accordance with an exemplary embodiment.

In one or more embodiments, the width of an upper portion of the one or more vertical fin(s) 200, approximately between the nitride cap 235 and the top spacer layer 160, may be reduced by selective etching of particular crystal faces of the one or more vertical fin(s) 200. At least an upper portion of the one or more vertical fin(s) 200 may thereby be thinned.

In various embodiments, etching the sides of an upper portion of a vertical fin 200 may also remove vertical fin material below the top surface of the top spacer layer 160.

In one or more embodiments, the width of the one or more second semiconductor segment(s) 220 approximately between the nitride cap 235 and the top spacer layer 160 may be reduced by selective etching of particular crystal faces of the one or more second semiconductor segment(s) 220. At least an upper portion of the one or more second semiconductor segment(s) 220 may thereby be thinned.

In various embodiments, etching the sides of an upper portion of a second semiconductor segment 220 may also remove second semiconductor segment material below the top surface of the top spacer layer 160. The second semiconductor segment 220 may extend from the p-n junction with the first semiconductor segment 210 to the nitride cap above the top surface of the top spacer layer 160.

In one or more embodiments, the thinned portion of the vertical fin(s) 200 may have a width in the range of about 2 nm to about 3 nm. In one or more embodiments, the thinned portion of the second semiconductor segment(s) 220 may have a width in the range of about 2 nm to about 3 nm. The nitride caps 235, 236 may be supported on the tops of the thinned portions of the vertical fin(s) 200 and/or second semiconductor segment(s) 220.

Figure 17:
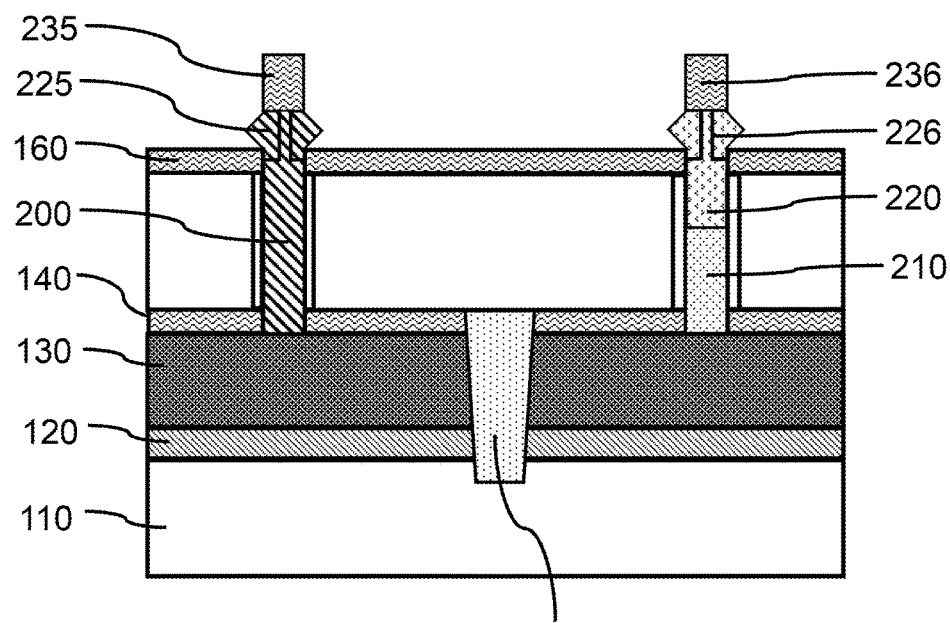
FIG. 17 is a cross-sectional side view of a vertical fin with a source/drain and a second semiconductor segment with a anode/cathode in accordance with an exemplary embodiment.

FIG. 17 is a cross-sectional side view of a vertical fin with a source/drain and a second semiconductor segment with an anode/cathode in accordance with an exemplary embodiment.

In one or more embodiments, a doped material forming a top source/drain 225 may be formed on the one or more vertical fin(s) 200. The top source/drain 225 may be formed by epitaxial growth on the exposed surface of the thinned portion of the vertical fin(s) 200, such that the vertical fin 200 and the top source/drain 225 have the same crystal orientation. The top source/drain 225 may be n-doped or p-doped. The top source/drain may be doped in-situ during deposition of the top source/drain 225.

In one or more embodiments, a doped material forming a top anode/cathode 226 may be formed on the one or more second semiconductor segment(s) 220. The top anode/cathode 226 may be formed by epitaxial growth on the exposed surface of the thinned portion of the second semiconductor segment(s) 220, such that the second semiconductor segment(s) 220 and the top anode/cathode 226 have the same crystal orientation. The top anode/cathode 226 may be n-doped or p-doped. The top anode/cathode may be doped in-situ during deposition of the top anode/cathode 226.

In various embodiments, the locations of the source and drain of a vertical transistor may be reversed such that the drain is on the top of a vertical fin, while the source is at the bottom. The source may, therefore, be at the bottom or the top.

Figure 18:
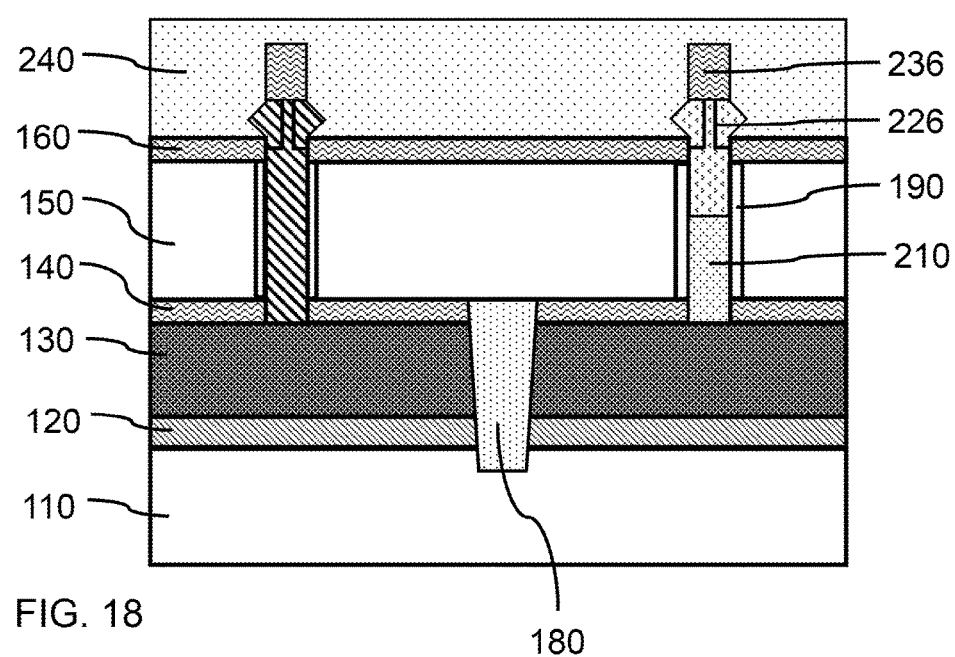
FIG. 18 is a cross-sectional side view of a spacer dielectric layer on the nitride caps, source/drain, and anode/cathode in accordance with an exemplary embodiment.

FIG. 18 is a cross-sectional side view of a spacer dielectric layer on the nitride caps and source/drains in accordance with an exemplary embodiment.

In various embodiments, a dielectric material 240, for example, silicon oxide (e.g., $SiO_2$), may be formed on the top spacer layer 160 and cover the nitride caps 235 and the source/drains 225 on the vertical fin(s) 200, and the nitride caps 236 and anode/cathode 226 on the second semiconductor segment(s) 220 respectively. The dielectric material 240 may be blanket deposited over the nitride caps 235, 236 the source/drains 225, and anode/cathodes 226. In various embodiments, the height of the dielectric material 240 may be reduced by chemical-mechanical polishing (CMP) and/or etching.

Figure 19:
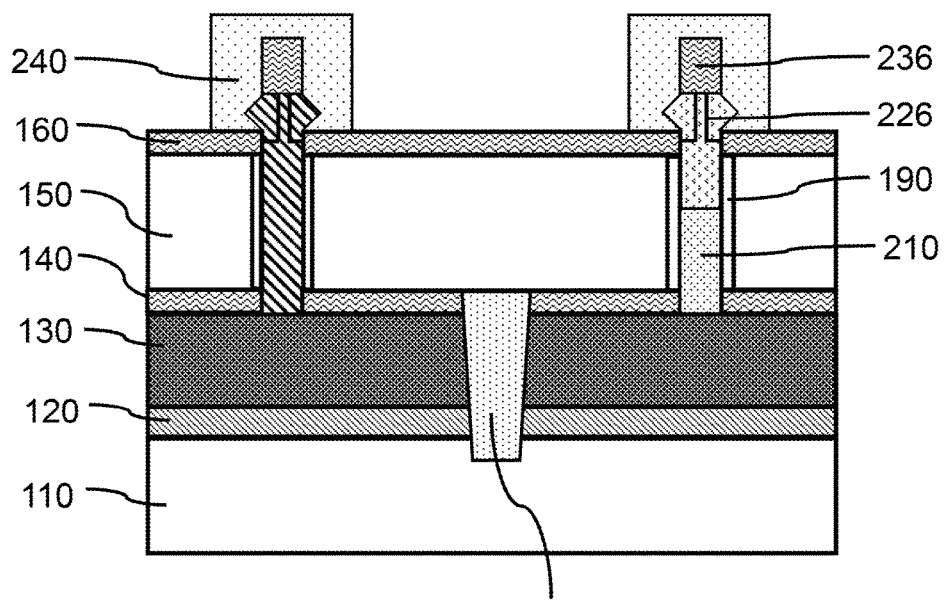
FIG. 19 is a cross-sectional side view of a patterned spacer dielectric layer over the caps, source/drain, and anode/cathode in accordance with an exemplary embodiment.

FIG. 19 is a cross-sectional side view of a patterned dielectric layer over the nitride caps and source/drains in accordance with an exemplary embodiment.

In one or more embodiments, the dielectric material 240 may be patterned and portions removed to expose portions of the underlying top spacer layer 160. The dielectric material 240 may act as a hardmask for removing portions of the top spacer layer 160 and the dummy gate layer 150.

Figure 20:
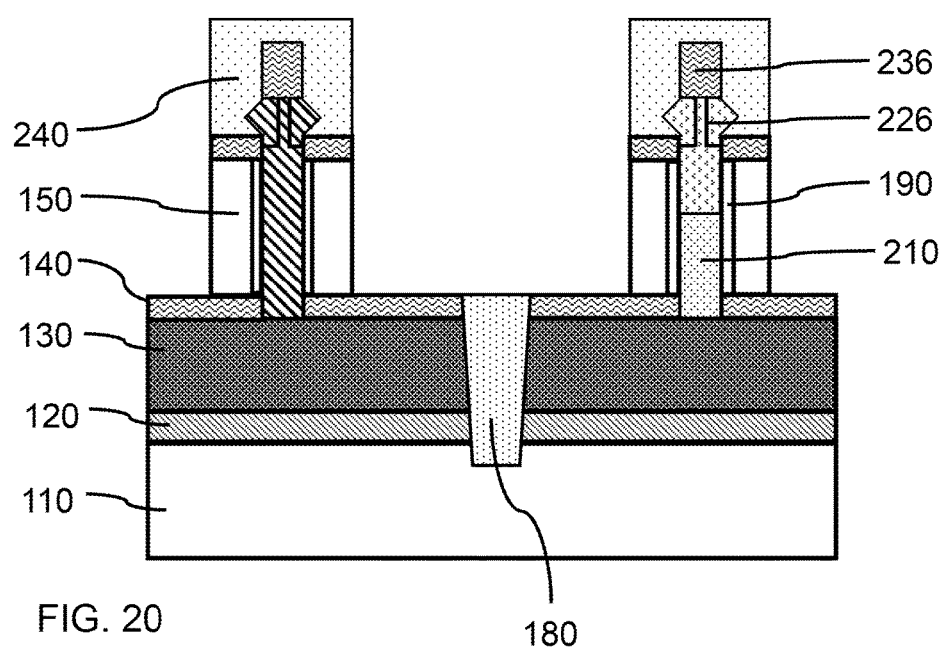
FIG. 20 is a cross-sectional side view of a portion of the top spacer layer and a portion of the dummy gate layer removed in accordance with an exemplary embodiment.

FIG. 20 is a cross-sectional side view of a portion of the top spacer layer and a portion of the dummy gate layer removed in accordance with an exemplary embodiment.

In one or more embodiments, a portion of the top spacer layer 160 and a portion of the dummy gate layer 150 may be removed. The top spacer layer 160 and the dummy gate layer 150 may be removed by a directional RIE.

Figure 21:
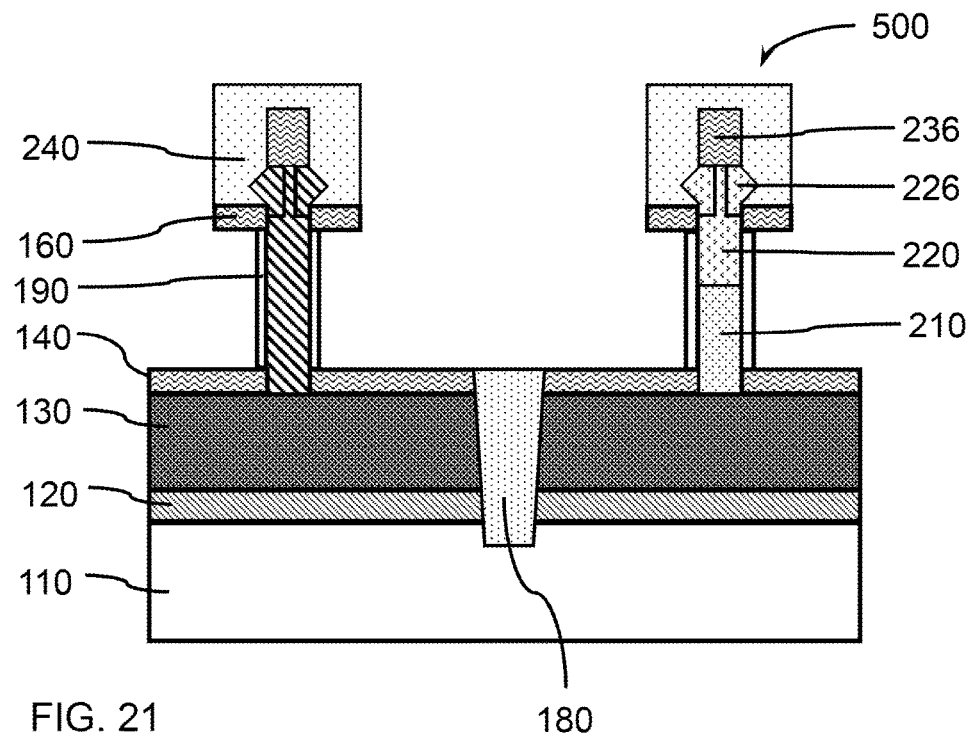
FIG. 21 is a cross-sectional side view of the dummy gate layer removed from a vertical fin in accordance with an exemplary embodiment.

FIG. 21 is a cross-sectional side view of the dummy gate layer removed from a vertical fin in accordance with an exemplary embodiment.

Figure 22:
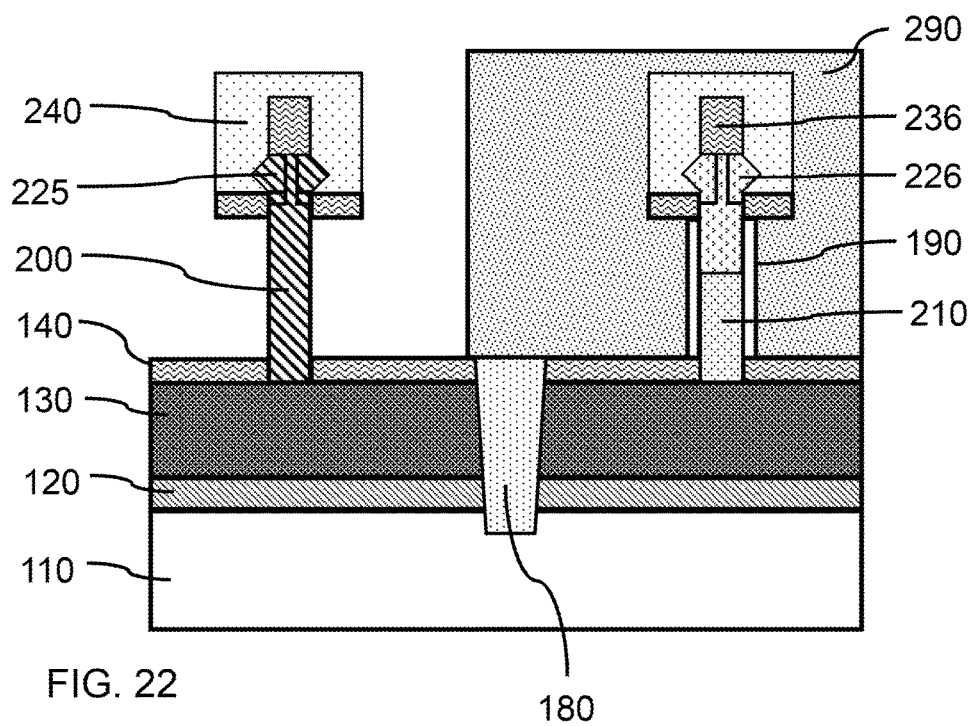
FIG. 22 is a cross-sectional side view of the dummy layer liners removed from the vertical fin and a soft mask over a vertical diode structure in accordance with an exemplary embodiment.

In one or more embodiments, the remaining portion of the dummy gate layer 150 shadowed by the patterned dielectric material 240 and remaining portion of the top spacer layer 160 may be removed to expose the dummy layer liners 190 on the vertical fins 200, and on the first semiconductor segments 210 and second semiconductor segments 220 of a vertical diode 500. The remaining portion of the dummy gate layer 150 may be removed by a wet chemical etch FIG. 22 is a cross-sectional side view of the dummy layer liners removed from the vertical fin and a soft mask over a vertical diode structure in accordance with an exemplary embodiment.

In one or more embodiments, the dummy layer liners 190 on the vertical fins 200 may be removed by a wet etch or RIE, where the wet etch or RIE may selectively remove silicon oxide.

In various embodiments, the vertical fins 200 may have height in the range of about 14 nm to about 120 nm, or in the range of about 16 nm to about 110 nm, or in the range of about 20 nm to about 30 nm, where the height is measured from the heavily doped source 130 to the bottom of the source/drain 225.

In one or more embodiments, a soft mask 290 may be formed on the diode structure to protect the diode structure during the removal of the dummy layer liners 190 and formation of gate dielectric layers, work function layers, and gate metal layers.

Figure 23:
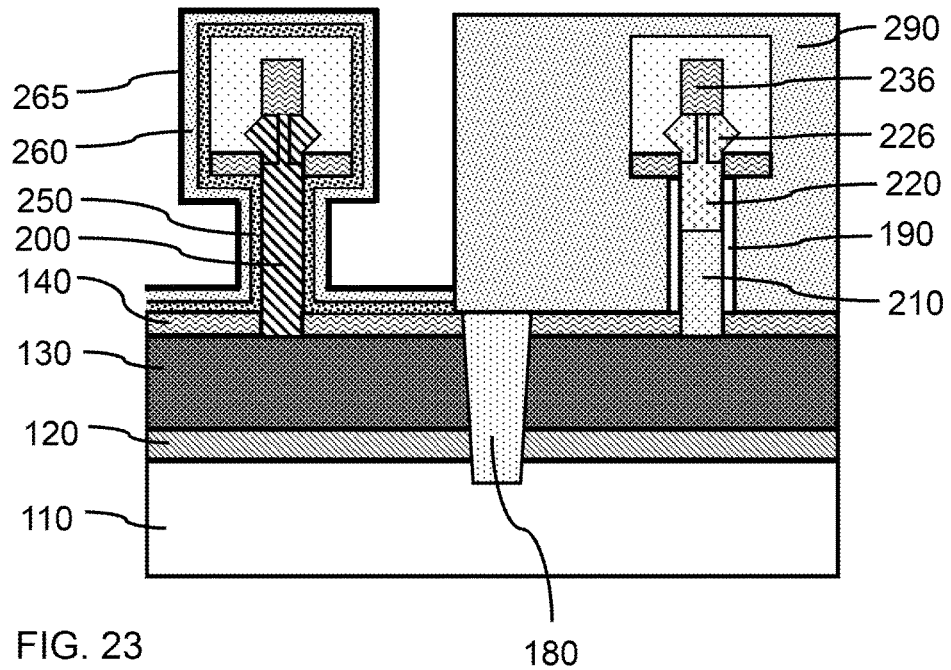
FIG. 23 is a cross-sectional side view of a gate dielectric layer and a work function layer formed on the sides of a vertical fin in accordance with an exemplary embodiment.

FIG. 23 is a cross-sectional side view of a gate dielectric layer and a work function layer formed on the sides of a vertical fin in accordance with an exemplary embodiment.

In one or more embodiments, a gate dielectric layer 250 may be formed on the vertical fin 200, bottom spacer layer 140, and dielectric material 240, where the gate dielectric layer 250 may be conformally deposited. The gate dielectric layer 250 may be conformally deposited by ALD and/or CVD.

In various embodiments, the gate dielectric layer 250 may be a high-K material, including but is not limited to metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3} Nb_{2/3} O_3$). The high-k dielectric material may further include dopants such as lanthanum and/or aluminum. The stoichiometry of the high-K dielectric material may vary.

In various embodiments, the gate dielectric layer 250 may have a thickness in the range of about 1.5 nm to about 2.5 nm.

In one or more embodiments, a work function layer 260 may be deposited over the gate dielectric layer 250, where the work function layer 260 may be conformally deposited by ALD and/or CVD.

In various embodiments, the work function layer 260 may be a nitride, including but not limited to titanium nitride (TiN), hafnium nitride (HfN), hafnium silicon nitride (Hf-SiN), tantalum nitride (TaN), tantalum silicon nitride (Ta-SiN), tungsten nitride (WN), molybdenum nitride (MoN), niobium nitride (NbN); a carbide, including but not limited to titanium carbide (TiC), tantalum carbide (TaC), hafnium carbide (HfC), and combinations thereof.

In various embodiments, the work function layer 260 may have a thickness in the range of about 1 nm to about 11 nm, or may have a thickness in the range of about 2 nm to about 5 nm.

In one or more embodiments, a gate metal layer 265 may be formed on the work function layer 160, where the gate metal layer 265 may include a thin layer conformally deposited on the work function layer 260, and/or a metal fill 270 to form a gate electrode. The gate metal layer 265 may be conformally deposited by atomic layer deposition (ALD) or CVD, where the gate metal layer 265 may have a thickness in the range of about 5 Å to about 15 Å.

In various embodiments, the gate metal layer 265 may be tungsten (W), aluminum (Al), titanium nitride (TiN), cobalt (Co), or a combination thereof. The total thickness of the gate metal layer 265 and the work function layer 260 may be in the range of about 6 nm to about 12 nm.

In various embodiments, the gate dielectric layer 250 and bottom spacer layer 140 remain on the heavily doped layer 130, and may provide electrical insulation between the heavily doped layer 130 and the gate metal layer 265 and/or metal fill 270. Unneeded metal(s) (gate metal layer 265, work function layer 260, and metal fill 270) may be etched away. The gate metal layer 265 and underlying work function layer 260 may be removed to avoid electrically shorting the fabricated components on the substrate (e.g., wafer).

Portions of the high-K layer 250 may also be removed in defining the gate structure for each vertical fin 200. In various embodiments, the high-K layer 250, the gate metal layer 265, and work function layer 260 may form a gate structure at least on opposite sides of the vertical fin 200. In various embodiments, the gate structure may wrap around three sides or four sides of the vertical fin.

Figure 24:
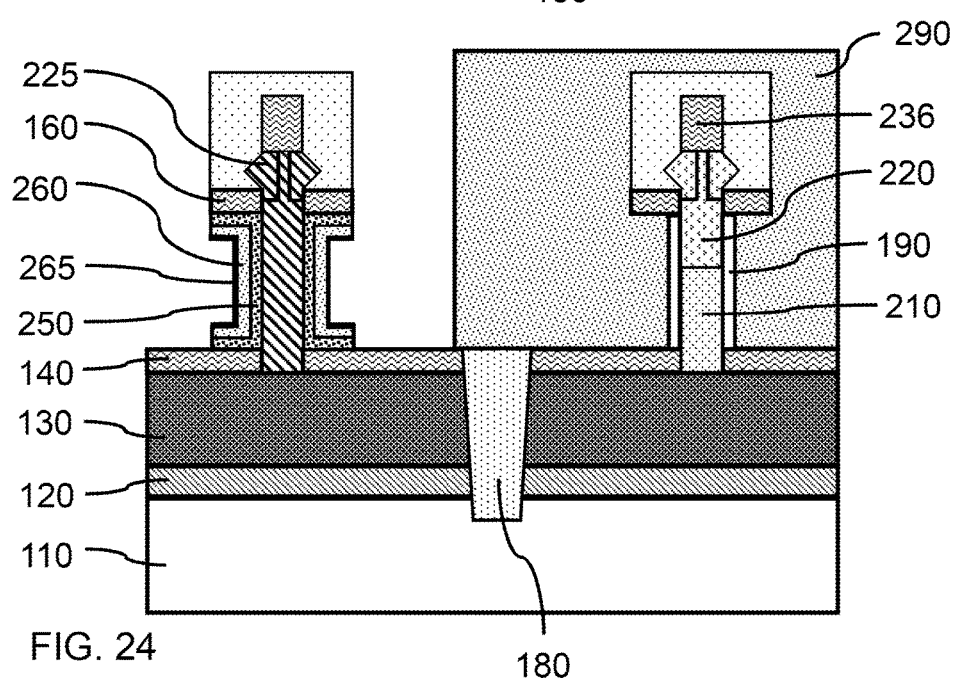
FIG. 24 is a cross-sectional side view of a vertical fin and gate structure in accordance with an exemplary embodiment.

FIG. 24 is a cross-sectional side view of a vertical fin and gate structure in accordance with an exemplary embodiment.

In one or more embodiments, the gate dielectric layer 250, work function layer 260 and the gate metal layer 265 may be removed from at least a portion of the bottom spacer layer 140 of the one or more vertical fins 200 to form a gate structure on the vertical fins 200. In various embodiments, each layer may be removed by a suitable directional etching process (e.g., RIE), where the underlying layer may act as an etch stop layer.

Figure 25:
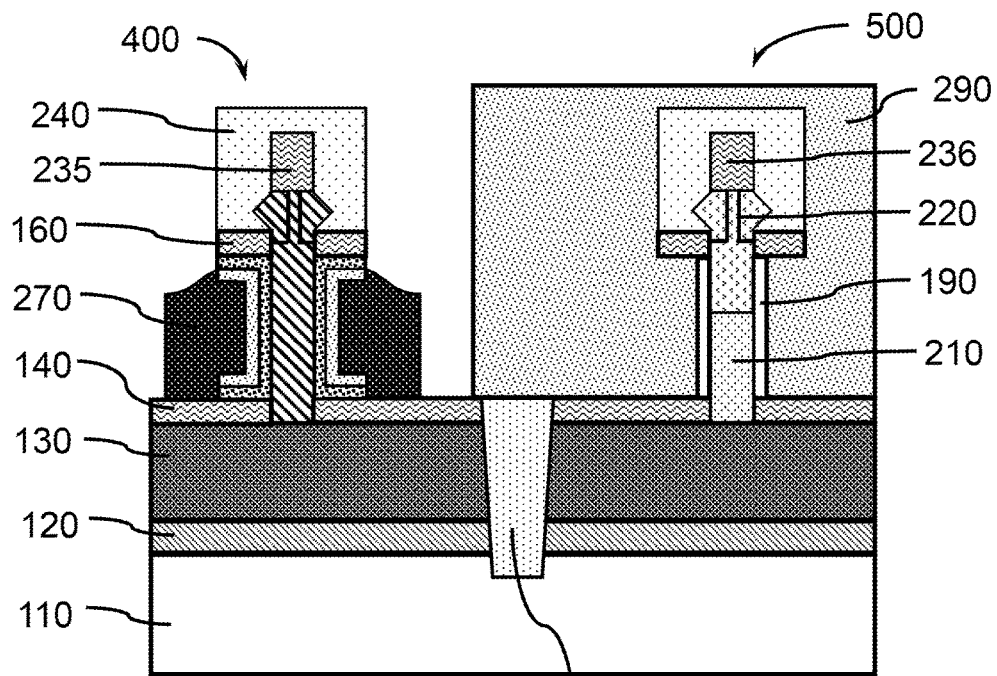
FIG. 25 is a cross-sectional side view of a vertical fin and gate structure with a gate metal layer and gate electrode in accordance with an exemplary embodiment.

FIG. 25 is a cross-sectional side view of a vertical fin and gate structure with a gate metal layer and gate electrode in accordance with an exemplary embodiment.

In one or more embodiments, a gate metal fill 270 may be deposited on the gate metal layer 265. In one or more embodiments, a gate metal fill 270 may be tungsten (W). The gate metal fill 270 may provide an electrical contact with the gate metal layer 265 of the gate structure for back end of line (BEOL) electrical connections.

In various embodiments, the gate metal fill 270 may extend laterally beyond the dielectric material 240 to allow formation of metal contact to the gate structure. The gate metal fill 270 may be electrically isolated from the heavily doped layer 130 by bottom spacer layer 140.

Figure 26:
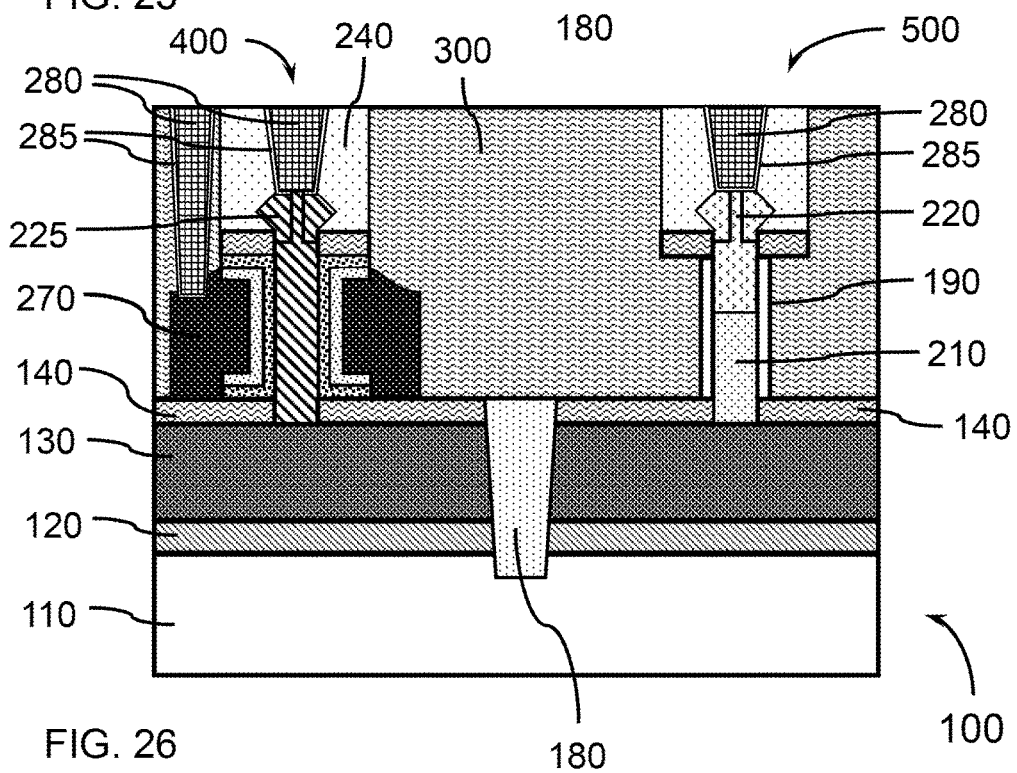
FIG. 26 is a cross-sectional side view of a vertical field effect transistor having a vertical fin, a gate structure with a gate electrode, and a vertical diode, in accordance with an exemplary embodiment.

FIG. 26 is a cross-sectional side view of a vertical field effect transistor having a vertical fin, a gate structure with a gate electrode, and a vertical diode, in accordance with an exemplary embodiment.

In one or more embodiments, the space above the metal fill 270 may be filled with a dielectric fill 300 to fill in the space between neighboring structures, including vertical fins 200 and vertical diodes, and provide electrical insulation between devices and components. In various embodiments, the soft mask 290 may be removed from the diode structure prior to forming the dielectric fill 300. In various embodiments, the soft mask 290 may remain on the diode structure, while the dielectric fill 300 is formed on the finFET structure, and the soft mask 290 removed and dielectric fill 300 formed on the diode structure in a separate stage. The middle-of-line contacts may be formed, where the gate, source and drain contacts may be made to the transistor components, and the anode/cathode contacts may be made to the diode using any well-known process for making contacts.

One or more trenches may be formed in the dielectric fill 300, soft mask 290, and/or dielectric material 240 by masking, patterning, and etching. The trench(es) may extend vertically down through the dielectric fill 300 to the metal fill 270 to form metal contacts for back end of line (BEOL) electrical connections to the gate structure(s).

In various embodiments, trenches may be etched vertically down through the dielectric material 240 to the top source/drain 225 to form metal contacts to the vertical finFET. The nitride cap 235 may be removed to allow access to the top surface of the top source/drain 225.

In various embodiments, trenches may be etched vertically down through the dielectric material 240 and soft mask 290 to the top anode/cathode 226 to form metal contacts to the vertical diode. The nitride cap 236 may be removed to allow access to the top surface of the top anode/cathode 226.

In various embodiments, the trench(es) may be filled with a barrier layer 285 and/or a metal contact fill 280. A barrier layer 285 may be selectively formed in trench(es) formed in the dielectric material 240 to the top source/drain 225, anode/cathode 226, and/or the top of the second semiconductor segment 220. In various embodiments, a metal contact fill 280 may be the same material as the metal fill 270, and may be formed in trenches to the metal fill 270 without an intervening barrier layer 285. In various embodiments, the metal contact fill 280 may be a different material from the metal fill 270, and an intervening barrier layer 285 may be formed between the metal contact fill 280 and the metal fill 270 to avoid alloying and/or diffusion.

In one or more embodiments, a metal contact fill 280 may be tungsten (W), aluminum (Al), or copper (Cu). In various embodiments, the barrier layer 285 may be titanium nitride (TiN), tantalum nitride (TaN), hafnium nitride (HfN), niobium nitride (NbN), tungsten nitride (WN), or combinations thereof, where the barrier layer may prevent diffusion and/or alloying of the metal contact fill material with the top source drain material, anode/cathode material, and/or metal fill 270. In various embodiments, the barrier layer may be conformally deposited in the trench(es) by ALD, CVD, MOCVD, PECVD, or combinations thereof. In various embodiments, the metal fill 270 may be formed by ALD, CVD, and/or PVD to form the electrical contacts.

In various embodiments, the top surfaces of the metal contact fill 280, dielectric fill 300, and/or dielectric material 240 may be chemically-mechanically polished to provide a uniform surface.

In one or more embodiments, a vertical finFET and vertical diode device may include a bulk substrate 110, a heavily doped layer 130, a shallow trench isolation region 180 dividing the heavily doped layer 130 into a plurality of heavily doped regions in the substrate to form a plurality of electrically separate bottom source/drains and bottom anode/cathodes, a counter-doped layer 120 beneath the heavily doped layer 130 to provide electrical isolation of the one or more heavily doped regions from the bulk substrate 110.

A vertical finFET 400 may include a vertical fin 200 formed on a bottom source/drain, a bottom spacer layer 140, where the bottom spacer layer may electrically insulate the bottom source/drain from components of a gate structure and/or metal fill 270. In various embodiments, the gate structure may include a high-K dielectric layer 250, a work function layer 260, and a gate metal layer 265. A metal fill 270 may be deposited in contact with the gate metal layer 265 to provide electrical contacts to the finFET gate structure.

The vertical finFET 400 may include a top source/drain 225 on the top of the vertical fin(s) 200, where the vertical fin(s) 200 form a vertical channel of a vertical finFET. The top source drain, bottom source/drain, and vertical fin form at least a portion of a vertical finFET. In various embodiments, the top source/drain and bottom source/drain may be n-doped or p-doped. The top source/drain and bottom source/drain also may be interchanged.

In one or more embodiments, the vertical diode 500 may include a first semiconductor segment 210 formed on a heavily doped region, a second semiconductor segment 220 formed on the first semiconductor segment 210, and a top anode/cathode 226 formed on the second semiconductor segment 220. The first semiconductor segment 210 and the a second semiconductor segment 220 may form a vertical diode, where the interface of the first semiconductor segment 210 and the a second semiconductor segment 220 may be a diode p-n junction.

In one or more embodiments, the vertical finFET and vertical diode device 100 includes a vertical diode 500 fabricated on the same substrate 110 as the vertical finFET 400, where the vertical diode 500 and vertical finFET 400 may be on the same coterminous region of the substrate surface. In various embodiments, the vertical diode 500 and vertical finFET 400 may be fabricated adjacent to each other on the same substrate 110, where the heavily doped region below the vertical finFET 400 may be separated from the heavily doped region below the vertical diode 500 by STI region 180.

In various embodiments, a metal contact fill 280 may be provided to each of the electrical contacts of the vertical finFET and the vertical diode. The vertical diode 500 and vertical finFET 400 may be electrically isolated from each other, or the vertical diode 500 and vertical finFET 400 may be electrically connected to each other.

In an exemplary embodiment, a vertical finFET and vertical diode device on the same substrate may have one or more vertical fins formed on a substrate; a doped region in the substrate located below at least one of the one or more vertical fins; a bottom spacer layer on the substrate 110 and adjacent the sidewall of at least one of the one or more vertical fins 200; a high-K dielectric layer 250 on at least a portion of the sidewalls of at least one of the one or more vertical fins; a work function layer 260 on the high-K dielectric layer 250 on the portion of the sidewalls of at least one of the one or more vertical fins; a gate metal layer 265 on at least a portion of the work function layer 260; a top spacer layer 160 having a thickness, wherein a bottom surface of the top spacer layer 160 is coplanar with a top surface of the high-K dielectric layer 250 on at least a portion of the sidewalls of at least one of the one or more vertical fins 200; and an oxide fill 300, where the oxide fill fills in at least a portion of the space between neighboring vertical finFETs 400 and/or vertical diodes 500.

An exemplary embodiment relates to a method of forming a vertical finFET and a vertical diode device on the same substrate, including forming a bottom spacer layer on a heavily doped layer; forming a dummy gate layer on the bottom spacer layer; forming a top spacer layer on the dummy gate layer; forming one or more fin trenches, where at least one of the one or more fin trenches passes through the top spacer layer, the dummy gate layer, and the bottom spacer layer; oxidizing at least a portion of the exposed portion of the dummy gate layer inside the one or more fin trenches to form a dummy layer liner; forming a vertical fin in at least one of the one or more fin trenches with the dummy layer liner; forming one or more diode trenches, where at least one of the one or more fin trenches passes through the top spacer layer, the dummy gate layer, and the bottom spacer layer; oxidizing at least a portion of the exposed portion of the dummy gate layer inside the one or more diode trenches to form a dummy layer liner; forming a first semiconductor segment in a lower portion of at least one of the one or more diode trenches with the dummy layer liner; and forming a second semiconductor segment in an upper portion of the at least one of the one or more diode trenches with the first semiconductor segment, where the second semiconductor segment is formed on the first semiconductor segment to form a p-n junction.

Having described preferred embodiments for the fabrication of vertical field effect transistor structure with controlled gate length (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a vertical fin field effect transistor (finFET) and a vertical diode device on the same substrate, comprising:

forming a channel layer stack on a heavily doped layer;
forming one or more fin trenches in the channel layer stack;
oxidizing at least a portion of the channel layer stack inside the one or more fin trenches to form a dummy layer liner;
forming a vertical fin in at least one of the one or more fin trenches with the dummy layer liner;
forming one or more diode trenches in the channel layer stack;
oxidizing at least a portion of the channel layer stack inside the one or more diode trenches to form a dummy layer liner;
forming a first semiconductor segment in a lower portion of at least one of the one or more diode trenches with the dummy layer liner; and
forming a second semiconductor segment in an upper portion of the at least one of the one or more diode trenches with the first semiconductor segment, where the second semiconductor segment is formed on the first semiconductor segment to form a p-n junction.

2. The method of claim 1, further comprising:
thinning an upper portion of at least one of the vertical fins formed in the at least one of the one or more fin trenches; and
forming a top source drain on the thinned portion of the at least one of the vertical fins.

3. The method of claim 1, wherein the channel layer stack includes a dummy gate layer and a bottom spacer layer, and the method further comprises:
removing the dummy gate layer and the dummy layer liner from at least one of the vertical fins formed in the at least one of the one or more fin trenches with the dummy layer liner to expose the sidewalls of the at least one vertical fin;
forming a high-K dielectric layer on at least an exposed surface of the bottom spacer layer and the sidewalls of the at least one vertical fin;
forming a work function layer on the high-K dielectric layer; and
forming a gate metal layer on the work function layer.

4. The method of claim 3, further comprising removing at least a portion of the gate metal layer, work function layer, and high-K dielectric layer on the exposed surface of the bottom spacer layer.

5. The method of claim 3, further comprising forming a metal fill on the bottom spacer layer, where the metal fill is in contact with the gate metal layer.

6. The method of claim 1, wherein the one or more vertical fins are formed by epitaxial growth from the heavily doped layer, and the first semiconductor segment is formed by epitaxial growth from the heavily doped layer.

7. The method of claim 6, wherein the top surface of the one or more vertical fins have a <100> crystal orientation.

8. The method of claim 1, wherein the second semiconductor segment is epitaxially grown on the first semiconductor segment, and has a top surface with a <100> crystal orientation.

9. A method of forming a vertical fin field effect transistor (finFET) and a vertical diode device on the same substrate, comprising:
forming a counter-doped layer on a substrate and a heavily doped layer on the counter-doped layer;
forming a bottom spacer layer on the heavily doped layer;
forming a dummy gate layer on the bottom spacer layer;
forming a top spacer layer on the dummy gate layer;
forming one or more fin trenches, where at least one of the one or more fin trenches passes through the top spacer layer, the dummy gate layer, and the bottom spacer layer;
oxidizing at least a portion of the exposed portion of the dummy gate layer inside the one or more fin trenches to form a dummy layer liner;
forming a vertical fin in at least one of the one or more fin trenches with the dummy layer liner;
forming one or more diode trenches, where at least one of the one or more diode trenches passes through the top spacer layer, the dummy gate layer, and the bottom spacer layer;
oxidizing at least a portion of the exposed portion of the dummy gate layer inside the one or more diode trenches to form a dummy layer liner;
forming a first semiconductor segment in a lower portion of at least one of the one or more diode trenches with the dummy layer liner; and
forming a second semiconductor segment in an upper portion of the at least one of the one or more diode trenches with the first semiconductor segment, where the second semiconductor segment is formed on the first semiconductor segment to form a p-n junction.

10. The method of claim 9, further comprising forming a top source/drain on a top of the one or more vertical fins.

11. The method of claim 9, further comprising forming one or more shallow trench isolation regions through the heavily doped layer and counter-doped layer to form a plurality of electrically separated heavily doped regions.

12. The method of claim 9, wherein the dummy layer liner provides protect to the one or more vertical fins during epitaxial growth.

13. The method of claim 9, further comprising:
removing the dummy gate layer and the dummy layer liner from at least one of the vertical fins formed in the at least one of the one or more fin trenches with the dummy layer liner to expose the sidewalls of the at least one vertical fin;
forming a conformal high-K dielectric layer on at least an exposed surface of the sidewalls of the at least one vertical fin;
forming a conformal work function layer on the high-K dielectric layer; and
forming a conformal gate metal layer on the work function layer.

14. The method of claim 13, where the conformal high-K dielectric layer, conformal work function layer, and/or conformal gate metal layer is formed by atomic layer deposition (ALD), chemical vapor deposition (CVD), or a combination thereof.

* * * * *